(12) United States Patent
Mannerma

(10) Patent No.: US 7,194,279 B2
(45) Date of Patent: Mar. 20, 2007

(54) ADJUSTMENT OF A PHASE DIFFERENCE BETWEEN TWO SIGNALS

(75) Inventor: Jari Mannerma, Salo (FI)

(73) Assignee: Nokia Corporation, Espoo (FI)

( * ) Notice: Subject to any disclaimer, the term of this patent is extended or adjusted under 35 U.S.C. 154(b) by 401 days.

(21) Appl. No.: 10/445,311

(22) Filed: May 23, 2003

(65) Prior Publication Data

US 2004/0248533 A1 Dec. 9, 2004

(51) Int. Cl.
*H04B 7/01* (2006.01)
*H04B 7/00* (2006.01)

(52) U.S. Cl. ............... 455/500; 455/502; 455/265; 375/145; 375/149; 375/362

(58) Field of Classification Search ......... 455/3.01, 455/456.6, 461, 132.2, 502, 67.11, 75–76, 455/265; 342/357.07, 357.12; 375/134, 375/137, 142, 145, 149, 124, 267, 376, 354–368
See application file for complete search history.

(56) References Cited

U.S. PATENT DOCUMENTS

| | | | | |
|---|---|---|---|---|
| 5,260,960 A | * | 11/1993 | Amann et al. | ......... 372/46.014 |
| 6,018,556 A | | 1/2000 | Janesch et al. | |
| 6,125,135 A | * | 9/2000 | Woo et al. | ............ 375/130 |
| 6,160,841 A | * | 12/2000 | Stansell et al. | ............ 375/148 |
| 6,163,567 A | * | 12/2000 | Hatch | ............ 375/149 |
| 6,272,168 B1 | * | 8/2001 | Lomp et al. | ............ 375/222 |
| 6,313,789 B1 | * | 11/2001 | Zhodzishsky et al. | . 342/357.12 |
| 6,516,021 B1 | * | 2/2003 | Abbott et al. | ............ 375/150 |
| 6,658,048 B1 | * | 12/2003 | Valio | ............ 375/150 |
| 6,664,921 B2 | * | 12/2003 | Pratt | ............ 342/357.06 |
| 6,760,364 B2 | * | 7/2004 | Kohli et al. | ............ 375/150 |
| 6,859,170 B2 | * | 2/2005 | Devereux et al. | ...... 342/357.06 |
| 7,072,380 B2 | * | 7/2006 | Ozluturk et al. | ............ 375/141 |
| 2003/0231704 A1 | * | 12/2003 | Tanaka et al. | ............ 375/150 |
| 2004/0120387 A1 | * | 6/2004 | Bultan et al. | ............ 375/149 |
| 2004/0213329 A1 | * | 10/2004 | Yano et al. | ............ 375/142 |

FOREIGN PATENT DOCUMENTS

| | | |
|---|---|---|
| DE | 3025326 | 1/1982 |
| EP | 0954103 | 11/1999 |

* cited by examiner

*Primary Examiner*—Simon Nguyen
(74) *Attorney, Agent, or Firm*—Alfred Fressola; Ware, Fressola, Van Der Sluys & Adolphson LLP

(57) ABSTRACT

A method for adjusting a phase difference between a received code modulated signal and a replica code sequence where, in order to enlarge the control range, it comprises a step of determining measurement values representing a phase difference between a received code modulated signal and a generated replica code sequence. The proposed method further comprises determining coefficients for a loop filter operation, which coefficients optimize a predetermined function specified for current properties of the received signal. Then, a loop filter operation is applied to the measurement values to obtain an indication of a required correction of a current frequency of the generated replica code sequence, which loop filter operation utilizes the determined coefficients. Finally, the frequency of the generated replica code sequence is adjusted based on the indication of a required correction. The invention relates equally to a corresponding unit and to a corresponding system.

24 Claims, 5 Drawing Sheets

ADJUSTMENT OF A PHASE DIFFERENCE BETWEEN TWO SIGNALS

FIELD OF THE INVENTION

The invention relates to a method for adjusting the phase difference between a received code modulated signal and a generated replica code sequence. The invention relates equally to a unit and a system for adjusting the phase difference between a received code modulated signal and a generated replica code sequence.

BACKGROUND OF THE INVENTION

Adjusting the phase difference between a received code modulated signal and a generated replica code sequence can be used in particular for minimizing the phase difference between the signals, in order to align the generated replica code sequence with the received code modulated signal. This is required for example in CDMA (Code Division Multiple Access) spread spectrum communications.

For a spread spectrum communication in its basic form, a data sequence is used by a transmitting unit to modulate a sinusoidal carrier and then the bandwidth of the resulting signal is spread to a much larger value. For spreading the bandwidth, the single-frequency carrier can be multiplied for example by a high-rate rectangular-shaped binary pseudo-random noise (PRN) code sequence comprising values of −1 and 1, which code sequence is known to a receiver. Thus, the signal that is transmitted includes a data component, a PRN component, and a sinusoidal carrier component. A PRN code period comprises typically 1023 chips, the term chips being used to designate the "noise" bits of the code conveyed by the transmitted signal, as opposed to the bits of the data sequence. A chip is the smallest feature of the signal which can be individually separated.

A well-known system which is based on the evaluation of such code modulated signals is GPS (Global Positioning System). In GPS, code modulated signals are transmitted by several satellites that orbit the earth and received by GPS receivers of which the current position is to be determined. Each of the satellites transmits two microwave carrier signals, a carrier signal L1 and a carrier signal L2. The carrier signal L1 is employed for carrying a navigation message and code signals of a standard positioning service (SPS). The L1 carrier signal is modulated by each satellite with a different C/A (Coarse Acquisition) Code known at the receivers. As C/A codes, so called Gold codes are employed. Thus, different channels are obtained for the transmission by the different satellites. The C/A code, which is spreading the spectrum over a 1 MHz bandwidth, is repeated every 1023 chips, the epoch of the code being 1 ms. The carrier frequency of the L1 signal is further modulated with the navigation information at a bit rate of 50 bit/s. The navigation information, which constitutes a data sequence, can be evaluated for example for determining the position of the respective receiver.

A receiver receiving a code modulated signal has to have access to a synchronized replica of the employed modulation code, in order to be able to de-spread the data sequence of the signal. To this end, a synchronization has to be performed between the received code modulated signal and an available replica code sequence. Usually, an initial synchronization called acquisition is followed by a fine synchronization called tracking. In both synchronization scenarios, a correlator is used to find the best match between the replica code sequence and the received signal and thus to find their relative shift called code phase. The search is performed with different assumptions on an additional frequency modulation of the received signal. Such an additional modulation occurs always due to a Doppler effect and may occur further, for example, due to a receiver clock inaccuracy and/or other higher order dynamic stresses. The additional modulation can be as large as +/−6 kHz. The phase of the received signal relative to the available replica sequence can have any possible value due to uncertainties in the position of the satellite and the time of transmission of the received signal.

A correlator aligns an incoming signal with a replica code sequence with different assumptions on the code-phase. The correlator then multiplies the incoming signal and the replica code sequence elementwise and integrates the resulting products to obtain a cross-correlation value for each code-phase. If the alignment is correct, the correlation will be higher than in the case of a misalignment. Thus, the cross-correlation peak is an indication of the correct code-phase.

Once the correct replica code sequence and the correct phase and frequency of this replica code sequence has been found for a received signal in an acquisition process, phase and frequency of the replica code sequence can be kept in synchronization with the received signal by means of a tracking loop.

A GPS receiver, for example, receives satellite signals from at least 4 GPS satellites and processes them through several channels. Presently, more than 7 channels are available in a GPS receiver. Tracking loops compare in every channel the received signal with a terminal-generated replica code sequences. Each generated replica code sequences corresponds to the known C/A code employed by another one of the GPS satellites. The comparison is made by calculating the cross-correlation between the received signal and the respective replica code sequence. The value of the cross-correlation function is then processed in a discriminator, the output of which is used to detect the phase difference and/or the frequency difference between the received signal and the replica code sequence. The tracking loop then changes the frequency of the generated replica code sequence until the phase and the frequency of the received signal and the replica code sequence are matching. When the phase difference between the satellite signal and the replica code sequence is zero, this corresponds to the maximum output value of the correlator.

The control range in which the tracking loop is able to maintain or achieve a synchronization is limited though. The output of the discriminator is the phase shift and in case of a code signal, it is often related to the phase shift between the chips of the input signal and the chips of the replica code sequence. If e.g. the used discriminator is an early-late DLL (Delay Lock Loop), the usable control range is from −1.5 to +1.5 chips in a conventional tracking loop. This control range is also referred to as pull-in range.

Due to several reasons, the state of the system can "jump" or drift away from the desired one, and often it moves simultaneously out of the pull-in range of the tracking loop. For example, during a navigation with a navigation satellite terminal located in an urban area, a sub-urban area or a forested area etc., it is expected that short-term interrupts of less than tens of seconds will occur in the reception of signals on a line-of-sight. Such interrupts may be sufficient to cause phase and frequency of the replica code sequence to leave the pull-in range.

Until now, this has meant that a terminal has to activate a power consuming reacquisition process or even an acquisition process to achieve the lock in the tracking loop again.

SUMMARY OF THE INVENTION

It is an object of the invention to improve the adjustment of a phase difference between a received code modulated signal and a generated replica code sequence. It is in particular an object of the invention to enlarge the control range of a tracking loop employed for adjusting such a phase difference.

A method is proposed for adjusting a phase difference between a received code modulated signal and a generated replica code sequence. The proposed method comprises a step of determining measurement values representing a current phase difference between a received code modulated signal and a generated replica code sequence. The proposed method further comprises determining coefficients for a loop filter operation, which coefficients optimize a predetermined function specified for current properties of the received signal. The predetermined function can be for instance a cost function which is optimized, e.g. minimized, with the determined coefficients. Then, a loop filter operation is applied to the measurement values to obtain an indication of a required correction of a current frequency of the generated replica code sequence, which loop filter operation utilizes the determined coefficients. Finally, the frequency of the generated replica code sequence is adjusted based on the indication of a required correction.

Moreover, a unit for adjusting a phase difference between a received code modulated signal and a generated replica code sequence is proposed. The proposed unit comprises an input portion for receiving a code modulated signal and a signal generating component for generating a replica code sequence. The proposed unit further comprises a processing portion for determining measurement values representing a current phase difference between a code modulated signal received by the input portion and a replica code sequence generated by the signal generating component. Finally, the proposed unit comprises a loop filter with a controlling portion and loop filter components. The controlling portion determines coefficients for the loop filter components, which coefficients optimize a predetermined function specified for current properties of a signal received by the input portion. The loop filter components apply a loop filter operation to measurement values provided by the processing portion to obtain an indication of a required correction of a current frequency of a replica code sequence generated by the signal generating component. The loop filter components utilize the determined coefficients. The signal generating component uses a frequency for generating the replica code sequence which is adjusted according to an indication of a required correction of a frequency of a currently generated replica code sequence provided by the loop filter.

The proposed unit can be in particular a mobile terminal receiving the code modulated signal, or a tracking loop module taking care for some mobile terminal of tracking a code modulated signal received by the mobile terminal.

In addition, a system is proposed which comprises the proposed unit and in addition a mobile terminal including a receiving portion for receiving a code modulated signal, and a transmitting portion for forwarding a received code modulated signal to the unit. That is, in this system, the processing according to the invention is not performed necessarily in a mobile terminal receiving the code modulated signal, but in a unit external to this mobile terminal. In this case, the unit could also be part of some network.

The invention proceeds from the consideration that at the limits of a pull-in range of a conventional tracking loop, the processing gain of an adaptive loop filter is higher than the processing gain of a conventional loop filter. The invention proceeds further from the consideration that the noise in received signals is statistically distributed around the phase error, usually according to the Gauss-function. In case of noise, some measurement values will thus emerge into the pull-in range of a conventional tracking loop, even if the phase error lies outside of the pull-in range.

It is therefore proposed to replace the conventional loop filter in a tracking loop by an adaptive loop filter. Due to its higher processing gain at the limits of the pull-in range of a conventional tracking loop, the adaptive loop filter is able to pull-in the error value into the limits of this pull-in range in a reasonable time. The more apart the phase error is from the lock state, the more time is required to reach the limits of the pull-in range of a conventional tracking loop. On the other hand, the system is not a linear function of time. The speed of the approach accelerates when moving towards the lock state. The effective control range that can be achieved according to the invention increases with the available noise. In case no noise is available, the effective control range corresponds to the pull-in range of a conventional tracking loop. But even then, the proposed adaptive system is faster if the control process must be initialized near the limits of the pull-in range.

In tracking loops using conventional loop filters, the ability to utilize noise in the control is poor due to the low processing gain of conventional loop filters at the critical domains of the control ranges i.e. near the limits of the pull-in range, where the output of the system is zero or close to zero.

It is an advantage of the invention that the wider effective control range achieved for signals having a low signal-to-noise ratio can maintain a tracking loop for a longer time in a lock state. Thus, the controllability of the tracking loop is increased.

Further, an acquisition or a reacquisition process, which has a higher power consumption than the tracking process, is needed less frequently. By reducing the number of required acquisition and reacquisition processes, a system making use of the invention is also more reliable. This is of particular interest, for instance, for a navigation with terminals performing a satellite based navigation in urban, suburban or forested areas, etc.

In an advantageous embodiment, statistical characteristics of noise, e.g. Gaussian noise, are reflected in the measurement values, in case noise is present in the received signal. In a further advantageous embodiment, the loop filter operation is improved in case no noise is present in the received signal by utilizing the determined coefficients, if an existing error value lies close to a border of an operating range of the loop filter operation, which operating range is given in case no noise is present in the received signal. This operation range corresponds to the pull-in range of the tracking loop.

The invention can be used to drive a tracking loop into a locked state and/or to maintain a tracking loop in a locked state, even when the system state has drifted out of the pull-in range of a conventional tracking loop.

The adaptive loop filter can be for example a Kalman filter, an entropy based filter or a minimum variance filter, e.g. a statistical minimum variance filter.

The adaptive loop filtering according to the invention can be realized in particular by software.

The invention can be employed in any unit which is to adjust the phase between a received code modulated signal and a generated replica code sequence, for example in the scope of positioning computations which are based e.g. on a satellite based positioning system like GPS.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE INVENTION

Figure 1:
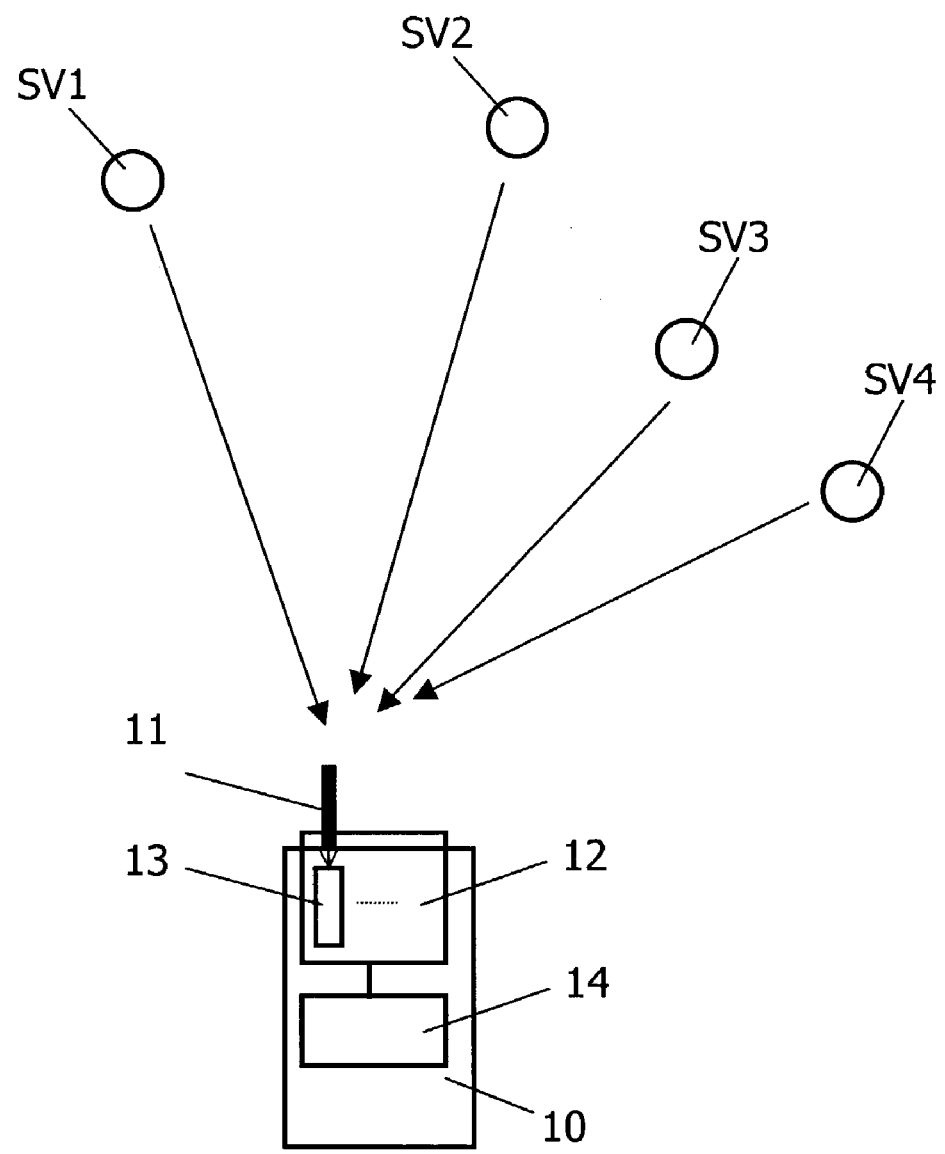
FIG. 1 schematically shows a system in which the invention is implemented.

FIG. 1 schematically presents a positioning system in which the invention is implemented.

The positioning system comprises a plurality of GPS satellites SV1, SV2, SV3, SV4 and a GPS receiver 10.

The GPS receiver 10 comprises an antenna 11, which is connected to a tracking module 12. The tracking module 12 comprises several tracking loops 13, of which only one is depicted in FIG. 1. Each tracking loop 13 forms part of a distinct processing channel for the received signals. Each tracking loop includes a PRN generator for generating a replica code sequence for signals from another GPS satellite. Usually, more than seven tracking loops are provided, i.e. replica code sequences for more than seven satellites can be generated. The output of the tracking module 12 is provided for further use to some other processing components 14.

When the GPS receiver 10 receives a signal from a satellite SV1, SV2, SV3, SV4, the GPS receiver 10 compares the code values of the received signal with the code values of the generated replica code sequences in the tracking module 12. In an acquisition procedure, first the replica code sequences are determined which are associated to the satellite from which the received signal originates. Further, the required phase and frequency of the replica code sequence is determined. Both are performed by a cross-correlation procedure. Thereafter, the received signal is tracked in the tracking loop 13 generating this replica code sequence, in order to ensure continuously that phase and frequency of the determined replica code sequence correspond to phase and frequency of the received signal.

Figure 2:
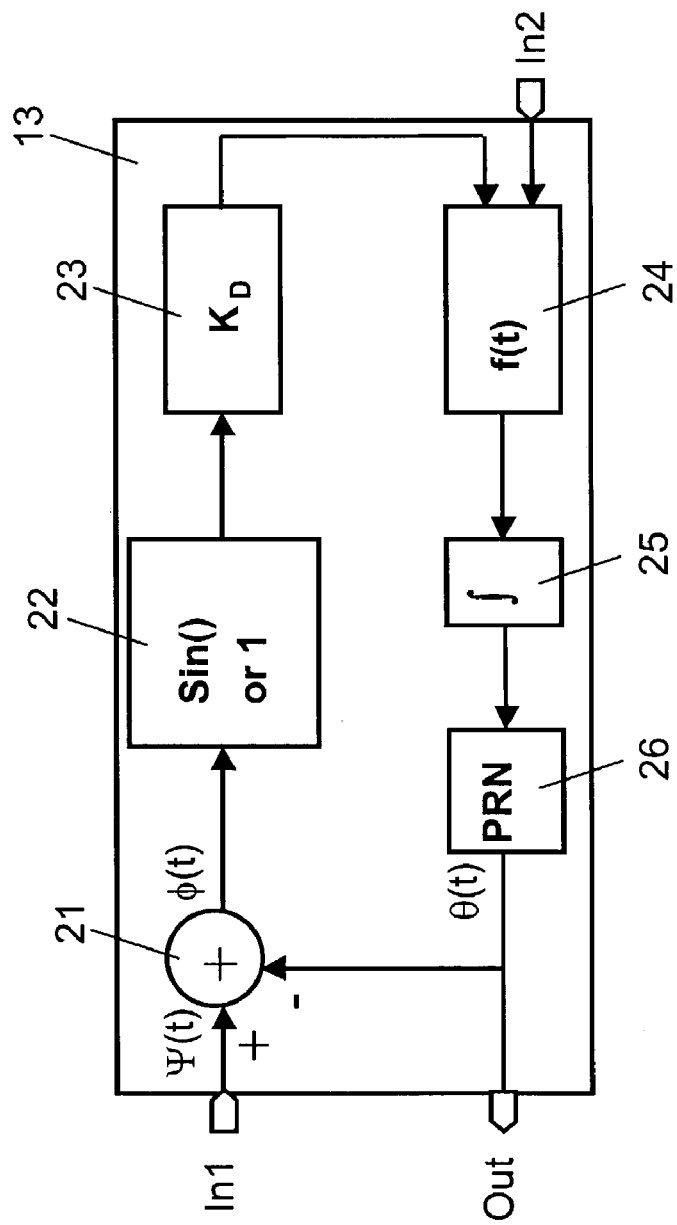
FIG. 2 is a block diagram of a PLL employed in the system of FIG. 1.

The structure of one of the tracking loops 13 is shown in more detail in FIG. 2. FIG. 2 is a block diagram of a PLL tracking loop.

An input "In1" of the tracking loop 13 is connected to a comparing component 21. The output of the comparing component 21 is connected via a distinguishing block 22, a discriminator KD 23, a loop filter f(t) 24 and an additive integrator 25 to a PRN generator 26. The adaptive loop filter 24 comprises in addition a second input connected to a second input "In2" of the tracking loop 13. The output of the PRN generator 26 is connected to a second input of the comparing component 21. The output of the PRN generator 26 constitutes at the same time the output "Out" of the tracking loop 13.

The comparing component 21 is depicted in FIG. 2 as a summing element. Such a summing element allows a particular flexible approach in the system theoretic sense. In practice, however, the comparing component 21 is realized by a mixer performing a pointwise multiplication between two received signals, thereby creating a cross-correlation function. The comparing component 21 could be followed by some nonlinear component (not shown), like a squarer which forms the second power of the signal value output by the comparing component 21 such that the negative values disappear.

The distinguishing block 22 indicates whether the tracking loop 13 is a carrier tracking loop, represented by "sin( )", or a code tracking loop, represented by "1".

In the case of a carrier tracking loop 13, the discriminator 23 can be for instance an FLL (frequency Lock Loop) or a PLL with the arctan-calculation. In the case of a code tracking loop 13, the discriminator can be for instance a linear PLL or a DLL (Delay Lock Loop).

In case of an analog system, the additive integrator 25 is a VCO (Voltage Controlled Oscillator) which controls the output frequency of the PRN generator 26, and in case of a digital tracking system, the additive integrator 25 is an NCO (Numerical Controlled Oscillator) which controls the output frequency of the PRN generator 26.

The tracking loop presented in FIG. 2 is a typical tracking loop, except that the loop filter is an adaptive loop filter, not a conventional loop filter.

A conventional loop filter includes amplifiers, integrators and/or derivators with constant coefficients. An adaptive loop filter 24 may comprise the same or similar basic components as a conventional loop filter, but at least some coefficients of the included components can be adjusted. In addition, the adaptive loop filter 24 comprises a controlling component for constantly updating the coefficients with desired algorithms.

Figure 3:
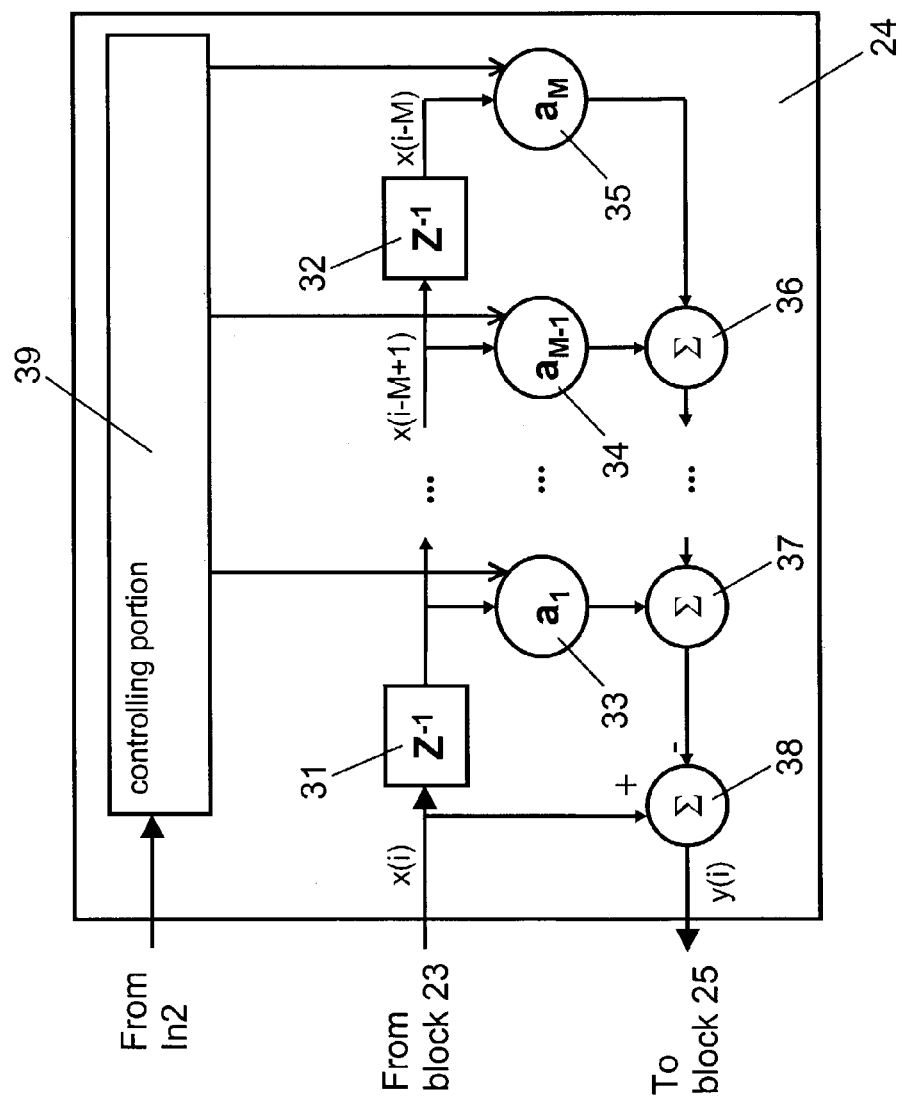
FIG. 3 is a block diagram of an adaptive loop filter of the PLL of FIG. 2.

FIG. 3 is a schematic block diagram of an exemplary adaptive loop filter 24 that can be used in the tracking loop of FIG. 2.

The adaptive loop filter 24 is connected by a first input and an output between the discriminator 23 and the additive integrator 25.

The first input of the adaptive loop filter 24 is connected within the adaptive loop filter 24 to components of a forward linear prediction filter. More specifically, the first input of the adaptive loop filter 24 is connected in sequence to M delay units 31, 32, denoted by $z^{-1}$. The output of each of the first to $M^{th}$ delay units 31, 32 is connected to a respective one of a first to $M^{th}$ weighting function 33, 34, 35. The respective weighting factors $a_1, \ldots, a_{M-1}$, and $a_M$ of the M weighting functions 33, 34, 35 constitute adaptive coefficients. The output of the $M^{th}$ weighting function 35 and the output of the $(M-1)^{th}$ weighting function 34 are connected to a first summing unit 36. The output of the first summing unit 36 and the output of the $(M-2)^{th}$ weighting function (not shown) are connected to a second summing unit (not shown). The output of the second summing unit and the output of the $(M-3)^{th}$ weighting function (not shown) are connected to a third summing unit (not shown), and so on. The output of an $(M-1)^{th}$ summing unit 37, to which the output of the first weighting function 33 is connected, is connected to an inverting input of an $M^{th}$ summing unit 38. To this $M^{th}$ summing unit 38, the input of the first delay unit

31 is connected in addition. The output of the $M^{th}$ summing unit is connected to the output of the adaptive loop filter 24.

The delay units 31, 32 delay an input signal x(i) to obtain differently delayed signals x(i−M+1), x(i−M), the weighting functions 33, 34, 35 weight the delayed signals x(i−M+1), x(i−M) separately with a respectively associated weighting factor $a_1, \ldots, a_{M-1}$, and $a_M$, and the summing units 36, 37, 38 subtract the sum of the delayed and weighted signals from the original signal x(i) to obtain an output signal y(i).

In addition to these actual loop filter components, the adaptive loop filter 24 comprises a controlling portion 39. The controlling portion 39 can be realized e.g. by software.

The controlling component 39 receives as input via the second input "In2" of the tracking loop 13 properties of the signal Ψ(t), which is currently received by the receiver 10 via its antenna 11. These properties may be physical properties of the received signal Ψ(t) and/or information included in the received signal Ψ(t). The controlling component 39 further comprises algorithms which minimize the power and the phase of the error signal under consideration of the received properties, resulting in optimal values of the coefficients $a_1, \ldots, a_{M-1}$ and $a_M$. The output of the controlling component is connected to a respective control input of the weighting functions 33, 34, 35.

Figure 4:
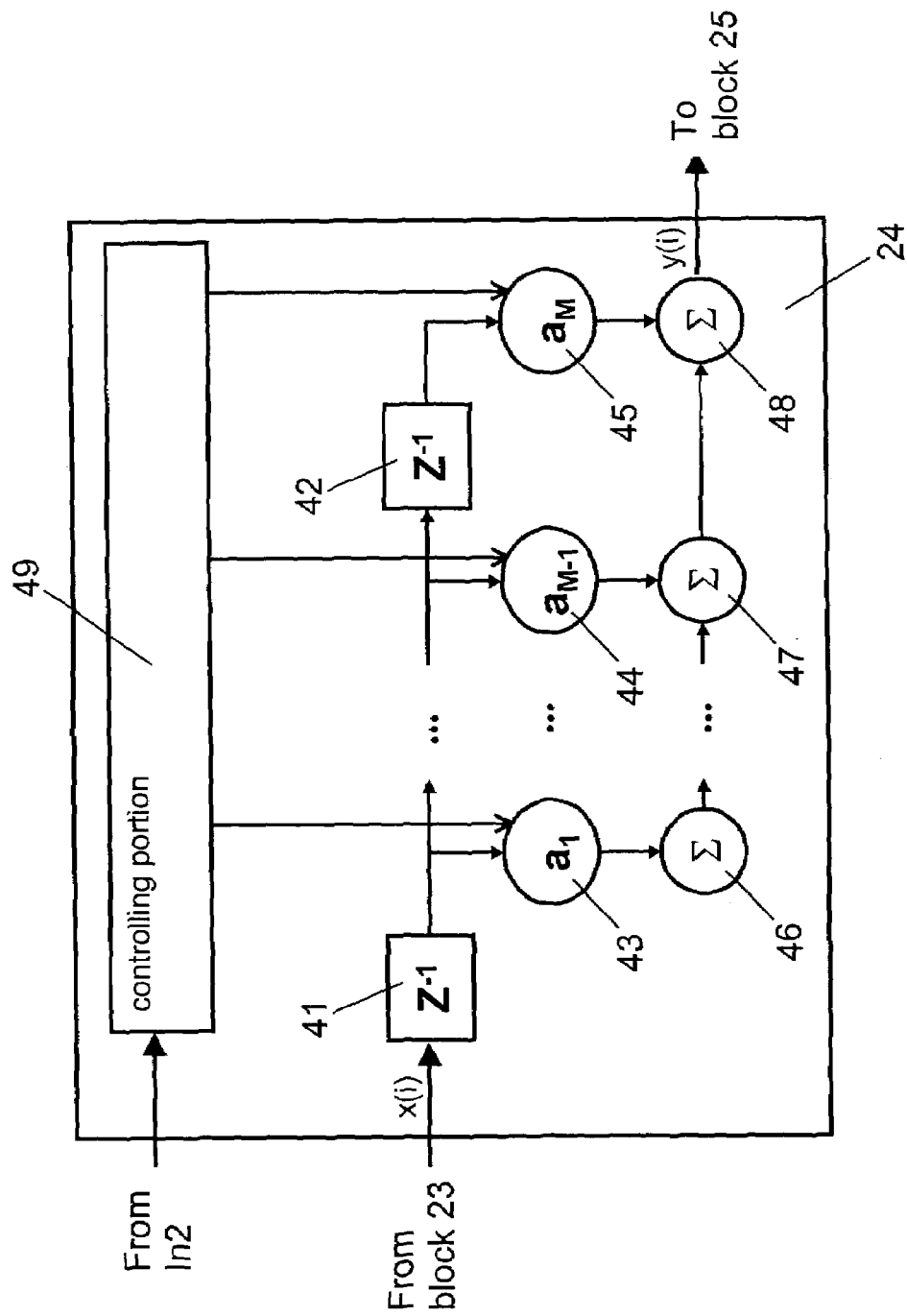
FIG. 4 is a block diagram of an alternative adaptive loop filter of the PLL of FIG. 2.

Instead of components of a forward linear prediction filter as depicted in FIG. 3, the adaptive loop filter 24 could also comprise for example components of a linear transversal filter, as depicted in FIG. 4. In this case, the first input of the adaptive loop filter 24 is connected again in sequence to M delay units 41, 42 denoted by $z^{-1}$. The output of each of the first to $M^{th}$ delay units 41, 42 is connected via a respective one of first to $M^{th}$ weighting functions 43, 44, 45 to a respective one of first to $M^{th}$ summing units 46, 47, 48. The respective weighting factors $a_1, \ldots, a_{M-1}$ and $a_M$ of the M weighting functions 43, 44, 45 constitute adaptive coefficients. The output of the first summing unit 46 is connected to the second summing unit (not shown), the output of the second summing unit is connected to the third summing unit, and so on. The output of the $M^{th}$ summing unit 48 is connected to the output of the adaptive loop filter 24.

The delay units 41, 42 delay an input signal x(i) to obtain differently delayed signals, the weighting functions 43, 44, 45 weight the delayed signals separately with a respectively associated weighting factor $a_1, \ldots, a_{M-1}$, and $a_M$, and the summing units 46, 47, 48 sum the delayed and weighted signals to obtain an output signal y(i).

In addition to these actual loop filter components, also the adaptive loop filter 24 of FIG. 4 comprises a controlling portion 49 corresponding to the controlling portion 39 of FIG. 3. The output of the controlling component is connected to a respective control input of the weighting functions 43, 44, 45.

Figure 5:
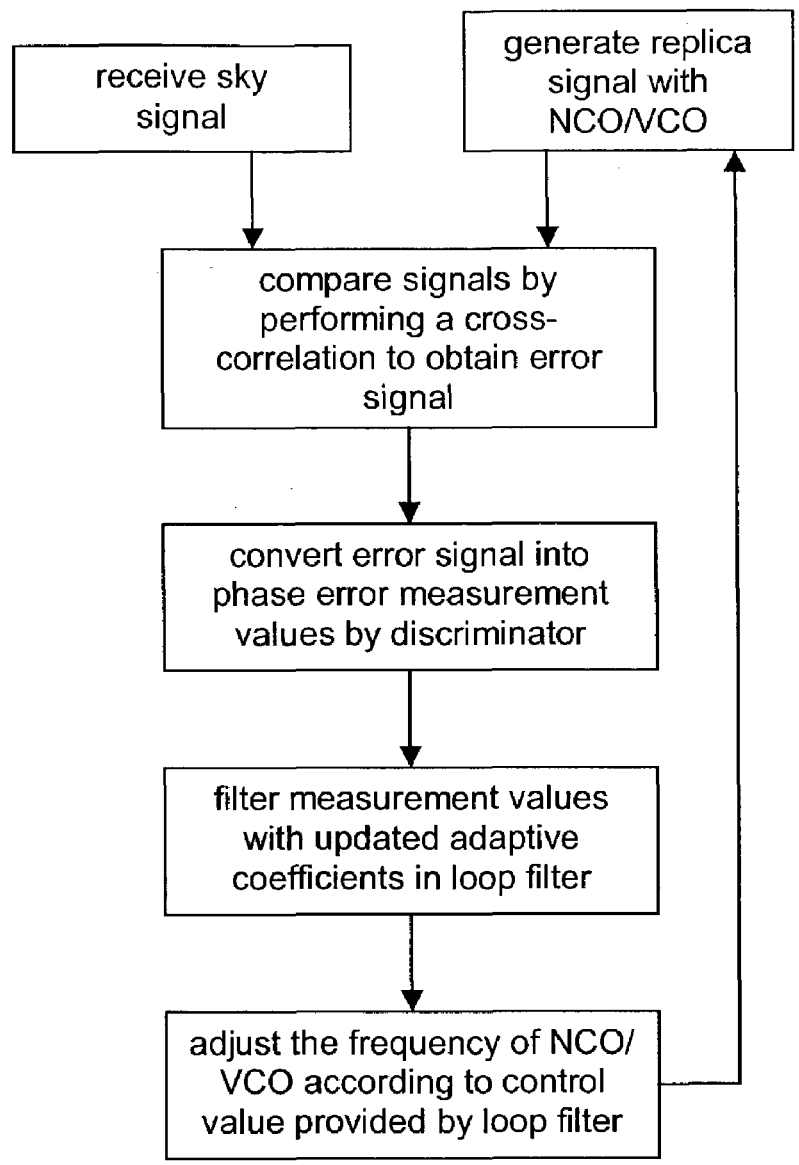
FIG. 5 is a flow chart illustrating an embodiment of the method according to the invention.

The operation of the tracking loop 13 of FIG. 2 will now be explained with reference to the flow chart of FIG. 5. It is the target of the tracking loop 13 to achieve a phase error of zero between a sky signal Ψ(t) input to the input "In1" of the tracking loop 13 and a signal Θ(t) provided at the output "Out" of the tracking loop 13.

A signal transmitted by one of the satellites SV1–SV4 is received by the receiver 10 via the antenna 11 from the sky. It is assumed that an acquisition has already been performed for this signal, i.e. it is known from which GPS satellite the received signal originates. Thus, the signal only has to be tracked in the tracking loop 13 provided for this satellite.

The received sky signal Ψ(t) is provided to this tracking loop 13. The comparing component 21 compares the phase of the received signal Ψ(t) with the phase of a replica code sequence Θ(t) which is currently generated by the PRN generator 26 of the tracking loop 13. The comparing component 21 outputs an error signal Φ(t) resulting in the comparison. In practice, the error signal Φ(t) is the result of a cross-correlation process.

Next, the distinguishing block 22 receives the error signal Φ(t). In case of a carrier tracking loop, the distinguishing block 22 outputs a sine signal sin(Φ(t)) as new error signal. In case of a code tracking loop, the distinguishing block 22 outputs the error signal Φ(t) itself.

The error signal provided by the distinguishing block 22 is then processed in the discriminator 23. More specifically, the discriminator 23 converts a received error signal, represented e.g. by a power value, into a phase or angle value in radians. The discriminator 23 provides resulting phase or angle values as measured values for the phase error to the adaptive loop filter 24. The discriminator 23 allows only a finite pull-in range of ±1.5 chips.

The adaptive loop filter 24 filters the measurement values using coefficients $a_1, \ldots, a_{M-1}$, and $a_M$, which are calculated by the control component 39 based on properties of the currently received signal Ψ(t). The coefficients are adapted by the control component 39 in real-time in the time domain. Thereby, a higher processing gain is achieved near the limits of the pull-in range of ±1.5 chips than with a conventional loop filter.

As long as the actual phase error lies within the limits of ±1.5 chips, the functioning of the adaptive loop filter 24 is the same as the functioning of a conventional loop filter. The adaptive system is faster than the conventional system, though, if the control process must be initialized near one of the limits. If the actual phase error is larger than ±1.5 chips and the signal is noise affected, some measurement values provided by the discriminator 23 will extend nevertheless into the range between ±1.5 chips, due to the Gaussian distribution of the noise around the actual error value. Due to the higher processing gain, the adaptive loop filter 24 is able in this case to pull-in the error value into the range between ±1.5 chips in a reasonable time, e.g. in few tens of milliseconds. If there is enough white noise available, the effective pull-in range can be widened up to ±2.5 chips. This is not possible with the conventional loop filters due to their poor processing gain near the limits of ±1.5 chips.

The adaptive loop filter 24 determines whether the measurement values provided by the discriminator 23 are on the −1.5 chips side or on the +1.5 chips side of an error value of zero, and how far the measurement values are from an error value of zero. An error value of zero provided by the discriminator 23 indicates that the phase difference between the received sky signal Ψ(t) and the currently generated replica code sequence Θ(t) is zero. An error value of zero corresponds to the center point of a correlation function at which the output of a correlator has its maximum value. The adaptive loop filter 24 provides an indication in which direction and by which amount the phase of the generated replica code sequence should be adjusted in order to reduce the phase error.

Based on the indication provided by the adaptive loop filter 24, the additive integrator 25 computes a new frequency value for the PRN generator 26.

The PRN generator 26 then creates the desired replica signal Θ(t) with a frequency defined by the additive integrator 25. The additive integrator 25 will thus only change the frequency of the generated replica code sequence, but with the frequency, errors of the frequency and the phase of the replica code sequence can be corrected.

The replica code sequence Θ(t) generated by the PRN generator 26 is provided on the one hand to the comparing component 21 in order to enable a continuous tracking. On the other hand, the generated replica code sequence Θ(t) is provided at the output "Out" of the tracking loop 13 for further use to processing component 14, e.g. for enabling a decoding of the received sky signal Ψ(t) for positioning purposes.

The adaptive loop filter 24 may further comprise a decision function, which determines whether the measurement values provided by the discriminator 23 are too far away from the zero value for a pull-in even with the enlarged effective control range. In case it is decided that the measurement values are too far away from the zero value, a re-acquisition or new acquisition of the received sky signal is initiated.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method comprising:
   determining measurement values representing a current phase difference between a received code modulated signal and a generated replica code sequence;
   determining coefficients for a loop filter operation, which coefficients optimize a predetermined function specified for current properties of said received signal;
   applying a loop filter operation to said measurement values to obtain an indication of a required correction of a current frequency of said generated replica code sequence, which loop filter operation utilizes said determined coefficients; and
   adjusting a frequency of said generated replica code sequence based on said indication of a required correction.

2. A method according to claim 1, wherein said measurement values are determined by comparing the code values of said received signal and the code values of said generated replica code sequence to obtain an error signal, and by applying the function of a discriminator to said error signal for obtaining said measurement values.

3. A method according to claim 2, wherein said predetermined function determines at least one of the power and the phase of said error signal.

4. A method according to claim 1, wherein said properties of said received signal comprise physical properties of said received signal.

5. A method according to claim 1, wherein said properties of said received signal comprise information included in said received signal.

6. A method according to claim 1, wherein said predetermined function is a cost function which is optimized with the determined coefficients.

7. A method according to claim 1, wherein said coefficients are coefficients of at least one of a weighting function and a time delay unit of a loop filter enabling said loop filter operation.

8. A method according to claim 1, said method further comprising deciding in case the extent of a current phase difference between said received signal and said generated replica code signal exceeds a predetermined limit that one of an acquisition and a reacquisition is to be performed instead of adjusting the frequency of said generated replica code sequence.

9. A method according to claim 1, wherein in case noise is present in said received signal, statistical characteristics of said noise are reflected in said measurement values.

10. A method according to claim 9, wherein said noise is Gaussian noise.

11. A method according to claim 1, wherein in case no noise is present in said received signal, said loop filter operation is improved by utilizing said determined coefficients, if an existing error value lies close to a border of an operating range of said loop filter operation, which operating range is given in case no noise is present in said received signal.

12. An apparatus comprising:
    an input portion for receiving a code modulated signal;
    a signal generating component for generating a replica code sequence;
    a processing portion for determining measurement values representing a current phase difference between a code modulated signal received by said input portion and a replica code sequence generated by said signal generating component; and
    a loop filter comprising a controlling portion and loop filter components, said controlling portion determining coefficients for said loop filter components, which coefficients optimize a predetermined function specified for current properties of a signal received by said input portion, and said loop filter components applying a loop filter operation to measurement values provided by said processing portion to obtain an indication of a required correction of a current frequency of a replica code sequence generated by said signal generating component, wherein said loop filter components utilize said determined coefficients;
    wherein said signal generating component uses a frequency for generating said replica code sequence which is adjusted according to an indication of a required correction of a frequency of a currently generated replica code sequence provided by said loop filter.

13. The apparatus according to claim 12, wherein said processing portion comprises a comparing component comparing the code values of a signal received by said input portion and the code values of said replica code sequence generated by said signal generating component to obtain an error signal, and a discriminator for processing an error signal provided by said comparing component for obtaining said measurement values.

14. The apparatus according to claim 12, wherein in case noise is present in a received code modulated signal, statistical characteristics of said noise are reflected in said measurement values determined by said processing portion.

15. The apparatus according to claim 14, wherein said noise is Gaussian noise.

16. The apparatus according to claim 12, wherein in case no noise is present in a received code modulated signal, a loop filter operation applied by said loop filter component is improved by utilizing coefficients determined by said controlling portion, if an existing error value lies close to a border of an operating range of said loop filter operation, which operating range is given in case no noise is present in said received code modulated signal.

17. The apparatus according to claim 12, wherein said unit is a tracking loop module.

18. The apparatus according to claim 12, wherein said unit is a mobile terminal.

19. A system comprising a mobile terminal with a receiving portion for receiving a code modulated signal and a transmitting portion for forwarding a received code modulated signal, said system further comprising a unit with:
- an input portion for receiving a code modulated signal from said mobile terminal;
- a signal generating component for generating a replica code sequence;
- a processing component for determining measurement values representing a current phase difference between a code modulated signal received by said input portion and a replica code sequence generated by said signal generating component; and
- a loop filter comprising a controlling portion and loop filter components, said controlling portion determining coefficients for said loop filter components, which coefficients optimize a predetermined function specified for current properties of a signal received by said input portion, and said loop filter components applying a loop filter operation to measurement values provided by said processing component to obtain an indication of a required correction of a current frequency of a replica code sequence generated by said signal generating component, wherein said loop filter components utilize said determined coefficients;
- wherein said signal generating component uses a frequency for generating said replica code sequence which is adjusted according to an indication of a required correction of a frequency of a currently generated replica code sequence provided by said loop filter.

20. A system according to claim 19, wherein in case noise is present in a received code modulated signal, statistical characteristics of said noise are reflected in said measurement values determined by said processing portion.

21. A system according to claim 20, wherein said noise is Gaussian noise.

22. A system according to claim 19, wherein in case no noise is present in a received code modulated signal, a loop filter operation applied by said loop filter component is improved by utilizing coefficients determined by said controlling portion, if an existing error value lies close to a border of an operating range of said loop filter operation, which operating range is given in case no noise is present in said received code modulated signal.

23. An apparatus comprising:
- means for receiving a code modulated signal;
- means for generating a replica code sequence;
- means for determining measurement values representing a current phase difference between a code modulated signal received by said means for receiving and a replica code sequence generated by said means for generating; and
- means for controlling and loop filter components, said means for controlling determining coefficients for said loop filter components, which coefficients optimize a predetermined function specified for current properties of a signal received by said means for receiving, and said loop filter components applying a loop filter operation to measurement values provided by said means for determining measurement values to obtain an indication of a required correction of a current frequency of a replica code sequence generated by said means for generating a replica code sequence, wherein said loop filter components utilize said determined coefficients;
- wherein said means for generating a replica code sequence uses a frequency for generating said replica code sequence which is adjusted according to an indication of a required correction of a frequency of a currently generated replica code sequence provided by said means for controlling.

24. A unit according to claim 23, wherein said means for determining measurement values comprises a comparing component comparing the code values of a signal received by said means for receiving and the code values of said replica code sequence generated by said means for generating a replica code sequence to obtain an error signal, and a discriminator for processing an error signal provided by said comparing component for obtaining said measurement values.

* * * * *